United States Patent
Yamazaki et al.

(10) Patent No.: US 6,373,075 B1
(45) Date of Patent: *Apr. 16, 2002

(54) SEMICONDUCTOR DEVICE COMPRISING A SEMICONDUCTOR FILM HAVING SUBSTANTIALLY NO GRAIN BOUNDARY

(75) Inventors: Shunpei Yamazaki, Tokyo; Akiharu Miyanaga; Satoshi Teramoto, both of Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/687,290

(22) Filed: Oct. 13, 2000

Related U.S. Application Data

(60) Continuation of application No. 09/033,156, filed on Mar. 2, 1998, now Pat. No. 6,144,041, which is a division of application No. 08/620,759, filed on Mar. 18, 1996, now Pat. No. 5,824,574.

(30) Foreign Application Priority Data

Mar. 17, 1995 (JP) ............................................... 7-086331
Mar. 21, 1995 (JP) ............................................... 7-088787
Apr. 28, 1995 (JP) ............................................... 7-128920

(51) Int. Cl.⁷ ............................................... H01L 29/04
(52) U.S. Cl. ........................... 257/72; 257/66; 257/350; 257/351; 257/627
(58) Field of Search ............................... 257/57, 66, 72, 257/59, 627, 628, 347, 350, 351; 349/42, 43

(56) References Cited

U.S. PATENT DOCUMENTS

| | | | |
|---|---|---|---|
| 4,727,044 A | * 2/1988 | Yamazaki | .................... 437/45 |
| 5,147,826 A | * 9/1992 | Liu et al. | .................... 437/233 |
| 5,447,117 A | 9/1995 | Yonehara et al. | .............. 117/7 |
| 5,501,989 A | * 3/1996 | Takayama et al. | ............ 437/21 |
| 5,837,569 A | * 11/1998 | Makita et al. | .............. 438/486 |
| 5,858,823 A | * 1/1999 | Yamazaki et al. | .......... 438/166 |
| 5,886,366 A | 3/1999 | Yamazaki et al. | ............. 257/59 |
| 5,893,730 A | 4/1999 | Yamazaki et al. | .......... 438/166 |
| 5,923,968 A | 7/1999 | Yamazaki et al. | .......... 438/166 |
| 5,953,597 A | 9/1999 | Yamazaki et al. | .......... 438/161 |
| 5,956,581 A | 9/1999 | Yamazaki et al. | .......... 438/166 |
| 5,972,105 A | 10/1999 | Yamazaki et al. | ............. 117/8 |
| 6,144,041 A | * 11/2000 | Yamazaki et al. | ............ 257/49 |

FOREIGN PATENT DOCUMENTS

| | | | | |
|---|---|---|---|---|
| JP | 59-148322 A | * | 8/1984 | |
| JP | 61-184813 A | * | 8/1986 | .................. 437/174 |
| JP | 2-140915 A | * | 5/1990 | .................. 437/40 |
| JP | 6-252170 A | * | 9/1994 | .................. 437/41 |

* cited by examiner

Primary Examiner—Minh Loan Tran
(74) Attorney, Agent, or Firm—Fish & Richardson P.C.

(57) ABSTRACT

Semiconductor devices based on thin film transistors formed over substrates. In one embodiment, a semiconductor device comprises at least two thin film transistors formed over a substrate, each of said thin film transistors having a crystalline semiconductor film comprising silicon formed on an insulating surface as an active region thereof, wherein said crystalline semiconductor film of each of said two thin film transistors has substantially no grain boundary therein, and a crystal axis of said crystalline semiconductor film in one of said two thin film transistors deviates from a crystal axis of the crystalline semiconductor film of the other, and the deviation of the crystal axis is within ±10°.

18 Claims, 9 Drawing Sheets

SEMICONDUCTOR DEVICE COMPRISING A SEMICONDUCTOR FILM HAVING SUBSTANTIALLY NO GRAIN BOUNDARY

This application is a continuation (and claims the benefit of priority under 35 USC 120) of U.S. application Ser. No. 09/033,156, filed Mar. 2, 1998, now U.S. Pat. No. 6,144,041, which is a division of U.S. application Ser. No. 08/620,759, filed Mar. 18, 1996, now U.S. Pat. No. 5,824,574.

BACKGROUND OF THE INVENTION

1. Field of the Invention

The present invention relates to a technique by which a crystalline silicon film having a monocrystal-like region or a substantially monocrystal-like region is formed on a substrate having an insulating surface made of glass or the like. Also, the present invention relates to a technique by which a thin-film semiconductor device represented by a thin-film transistor is formed by using the crystalline silicon film.

2. Description of the Related Art

In the recent years, attention has been directed to a technique by which a thin-film transistor is constituted by using a thin-film silicon semiconductor film (a thickness of about several hundred to several thousand Å) which is formed on a substrate having a glass substrate or an insulating surface. What the thin-film transistor is applied to with the most expectancy is an active matrix type liquid-crystal display unit.

The active matrix type liquid-crystal display unit is structured such that liquid crystal is interposed between a pair of glass substrates and held therebetween. Also, it is structured such that a thin-film transistor is disposed on each of pixel electrodes which are arranged in the form of a matrix of several hundred x several hundred. Such structures require a technique by which the thin-film transistor is formed on a class substrate.

In the formation of the thin-film transistor on the glass substrate. it is necessary to form a thin-film semiconductor constituting thethin-film transistor on the glass substrate. For the thin-film semiconductor formed on the glass substrate, an amorphous silicon film formed through the plasma CVD technique or the low pressure thermal CVD technique is generally utilized.

Under existing circumstances, the thin-film transistor using the amorphous silicon film is practically used. However, in order to obtain display with a higher image quality, there is demanded a thin-film transistor utilizing a silicon semiconductor thin film (called "a crystalline silicon film") with a crystalline property.

Techniques disclosed in Japanese Patent Unexamined Publication No. 6-232059 and Japanese Patent Unexamined Publication No. 6-244103 made by the present applicant have been well known as a method of forming the crystalline silicon film on the glass substrate. The techniques disclosed in those publications are that a crystalline silicon film is formed on a glass substrate through a heat treatment under a heating condition which can be withstood by the class substrate, that is, approximately at 550° C. for 4 hours, by utilizing a metal element that promotes the crystallization of silicon.

However, the crystalline silicon film obtained by the method using the above-mentioned techniques is not available to a thin-film transistor that constitutes a variety of arithmetic operating circuits. memory circuits or the like. This is because its crystalline property is insufficient and a characteristic as required is not obtained.

As the peripheral circuits of the active matrix type liquid-crystal display unit or the passive type liquid-crystal display unit, there are required a drive circuit for driving a thin-film transistor disposed in a pixel region, a circuit for dealing with or controlling a video signal, a memory circuit for storing a variety of information etc.

Of those circuits, the circuit for dealing with or controlling a signal and the memory circuit for storing a variety of information are required to provide a performance equal to that of an integrated circuit using a known monocrystal wafer. Hence, when those circuits are to be integrated using the thin-film semiconductor formed on the glass substrate, the crystalline silicon film having the crystalline property equal to that of monocrystal must be formed on the class substrate As a method of enhancing the crystalline property of the crystalline silicon film, there have been proposed that the obtained crystalline silicon film is subjected to a re-heating treatment or to the irradiation of a laser beam. However, it has been proved that, even though the heat treatment or the irradiation of a laser beam is repeatedly conducted, it is difficult to dramatically improve the crystalline property.

Also, a technique in which a monocrystal silicon thin film is obtained by using the SOI technique has now been researched. However, since the monocrystal silicon substrate cannot be utilized for the liquid-crystal display unit, the above technique cannot be applied directly to the liquid-crystal display unit. In particular, in the case of using a monocrystal wafer, it is difficult to apply the SOI technique to the liquid-crystal display unit having a large area a demand of which is expected to increase in the future because of a limited substrate area.

SUMMARY OF THE INVENTION

The present invention has been made in view of the above problems, and theretore an object of the present invention is to provide a technique in which a monocrystal or monocrystal-like region is formed on a substrate having an insulating surface, in particular, on a glass substrate, and a thin-film semiconductor device represented by a thin-film transistor is formed by using that region.

In order to solve the above-mentioned problems, according to one aspect of the present invention, there is provided a method of manufacturing a semiconductor, comprising the steps of:

forming a first semiconductor film on a substrate having an insulating surface;

applying an energy to said first semiconductor film to crystallize said first semiconductor film;

patterning said first semiconductor film to form a region that forms a seed crystal;

etching said seed crystal to selectively leave a predetermined crystal surface in said seed crystal;

covering said seed crystal to form a second semiconductor film; and applying an energy to said second semiconductor film to conduct a crystal growth from said seed crystal in said second semiconductor film.

In the above-mentioned structure, a silicon film is typically used for the first and second semiconductor films. Also, in general, an amorphous silicon film formed through the CVD technique is used for the silicon film.

The reason why the predetermined crystal surface is selectively left is to conduct the crystal growth so as to produce crystal more approximating monocrystal. Leaving the predetermined crystal surface may be achieved by using etching means having a selectivity with respect to the predetermined crystal surface. For example, using an etchant resulting from mixing $H_2O$ of 63.3 wt %. KOH of 23.4 wt % and isopropanol of 13.3 wt % together, a (100) face can be selectively left, as a result of which the seed crystal covered with the (100) face can be selectively left.

Also, a (111) face can be selectively left by etching in a gas phase using hydrazine ($N_2H_4$). Specifically, the (111) face can be left by dry etching using $ClF_3$ and $N_2H_4$ as an etching gas.

Further, as a method of applying the energy in the above-mentioned structure, one or plural kinds of methods selected from a heating method, a laser beam irradiation method and an intense light beam irradiation method can be used simultaneously or gradually. For example, a laser beam can be irradiated while heating, a laser beam can be irradiated after heating, heating and the irradiation of a laser beam can be alternately conducted, or heating can be conducted after the irradiation of a laser beam. Also, the laser beam may be replaced by an intense light beam.

In the case where the silicon film is used as a semiconductor film, and an energy is applied to the film to crystallize the silicon film, it is useful to use a metal element that promotes the crystallization of silicon. For example, when an amorphous silicon film formed by the plasma CVD technique or the low pressure thermal CVD technique is to be crystallized by heating, a heat treatment at a temperature of 600° C. or higher for 10 hours or longer is required. However, in the case of using a metal element that promotes the crystallization of silicon, the effect equal to or more than that of the above-mentioned heat treatment can be obtained by a heat treatment at 550° C. for 4 hours.

Nickel is the hiahest in its effect and useful as the metal element that promotes the crystallization of silicon. Also, one kind of plural kinds of elements selected from Fe, Co, Ru, Rh, Pd, Os, Ir, Pt, Cu and Au can be used. In particular, Fe, Pd, Pt, Cu and Au can obtain the better effect next to Ni.

A monocrystal-like region or a substantially monocrystal-like region can be formed in a predetermined region by conducting a crystal growth from the seed crystal. The monocrystal-like region or the substantially monocrystal-like region is defined as a region that satisfies conditions stated below.

No grain boundary substantially exists in the region.

A hydrogen or halogen element that neutralizes a point defect is contained at a density of 0.001 to 1 atm % in the region.

Carbon and nitrogen atoms are contained at a density of $1 \times 10^{16}$ to $5 \times 10^{18}$ atm $cm^{-3}$ in the region.

Oxygen atoms are contained at a density of $1 \times 10^{17}$ to $5 \times 10^{19}$ atm $cm^{-3}$ in the region.

According to another aspect of the present invention, there is provided a method of manufacturing a semiconductor, comprising the steps of:

forming a first silicon film on a substrate having an insulating surface;

bringing said first silicon film in contact with a metal element that promotes the crystallization of silicon and holding said first silicon film:

applying an energy to said first silicon film to crystallize said first silicon film;

patterning said first silicon film to form a region that forms a seed crystal:

etching said seed crystal to selectively leave a predetermined crystal orientation in said seed crystal;

covering said seed crystal to form a second silicon film;

bringing said first silicon film in contact with a metal element that promotes the crystallization of silicon and holding said first silicon film:

applying an energy to said second silicon film to conduct a crystal growth from said seed crystal in said second silicon film.

According to still another aspect of the present invention, there is provided a method of manufacturing a semiconductor, comprising the steps of:

forming a first silicon film on a substrate having an insulating surface;

applying an energy to said first silicon film to crystallize said first silicon film;

patterning said first silicon film to form a region that forms a seed crystal;

etching said seed crystal to selectively leave a predetermined crystal orientation in said seed crystal;

covering said seed crystal to form a second silicon film;

applying an energy to said first silicon film to conduct a crystal growth from said seed crystal in said first silicon film; and conducting a patterning including at least a removal of the region in which said seed crystal is formed to form an active layer of the semiconductor device.

The above-mentioned structure is characterized in that the region of the active layer thus obtained comprises a monocrystal-like region or a substantially monocrystal-like region. This region is defined as a region in which no grain boundary substantially exists, a hydrogen or halogen element which neutralizes a point detect is contained at a density of 0.001 to 1 atm %, carbon and nitrogen atoms are contained at a density of $1 \times 10^{16}$ to $5 \times 10^{18}$ atm $cm^{-3}$, and oxygen atoms are contained at a density of $1 \times 10^{17}$ to $5 \times 10^{19}$ atm $cm^{-3}$.

According to still another aspect of the present invention, there is provided a method of manufacturing a semiconductor, comprising the steps of:

forming a first silicon film on a substrate having an insulating surface;

applying an energy to said first silicon film to crystallize said first silicon film;

patterning said first silicon film to form a region that forms a seed crystal;

etching said seed crystal to selectively leave a predetermined crystal orientation in said seed crystal;

covering said seed crystal to form a second silicon film;

conducting a patterning to form said second silicon film in a rectangular shape;

applying an energy to said second silicon film to conduct a crystal growth from said seed crystal in said second silicon film; and conducting a patterning including at least a removal of the region in which said seed crystal is formed with respect to said second silicon film to form an active layer of the semiconductor device;

wherein said seed crystal is positioned at a corner of said second silicon film which is formed in the rectangular shape.

A specified example using the above-mentioned structure is shown in FIG. 3. In FIG. 3, a seed crystal 303 is positioned at a corner portion 304 of an amorphous silicon film 302 which is formed in a rectangular shape, and a laser beam which has been processed into a beam linearly is irradiated onto the amorphous silicon film 302 from the corner while being scanned thereon to thereby crystallize the amorphous silicon film 302.

FIG. 3 shows an example in which the silicon film 302 (amorphous silicon film) is patterned in a quadrangle. However, it may be of a square or a rectangle.

According to yet still another aspect of the present invention, there is provided a method of manufacturing a semiconductor, comprising the steps of:

forming a first silicon film on a substrate having an insulating surface;

applying an energy to said first silicon film to crystallize said first silicon film;

patterning said first silicon film to form a region that forms a seed crystal;

etching said seed crystal to selectively leave a predetermined crystal orientation in said seed crystal;

covering said seed crystal to form a second silicon film;

conducting a patterning to form said second silicon film in a polygonal shape;

applying an energy to said second silicon film to conduct a crystal growth from said seed crystal in said second silicon film and conducting a patterning including at least a removal of the region in which said seed crystal is formed with respect to said second silicon film to form an active layer of the semiconductor device;

wherein said seed crystal is positioned at a corner of said second silicon film which is formed in the polygonal shape.

A specified example using the above-mentioned structure is shown in FIG. 4. In FIG. 4, a seed crystal 404 is positioned at a corner portion 403 of an amorphous silicon film 401 which is patterned in a pentagon of the home base type, and a laser beam which has been processed into a beam linearly is irradiated onto the amorphous silicon film 401 from the corner while being scanned thereon to thereby crystallize the amorphous silicon film 401.

FIG. 4 shows an example in which the silicon film is patterned in a pentagon. However, it may be of a polygon having more corners. It should be noted that as the number of corners is increased, the angle of a corner is necessarily increased more, to thereby reduce such an effect that crystallization progresses from the corner.

According to yet still another aspect of the present invention, a method of manufacturing a semiconductor, comprising the steps of:

forming a first silicon film on a substrate having an insulating surface;

applying an energy to said first silicon film to crystallize said first silicon film;

patterning said first silicon film to form a region that forms a seed crystal;

etching said seed crystal to selectively leave a predetermined crystal face in said seed crystal;

covering said seed crystal to form a second silicon film:

applying an energy to said second silicon film to conduct a crystal growth from said seed crystal in said second silicon film; and patterning said second silicon film to remove at least a portion where said seed crystal exists;

wherein said second silicon film after having been patterned contains therein a hydrogen of 0.001 to 1 atm % and a metal element that promotes the crystallization of silicon with a density of $1\times10^{16}$ to $1\times10^{19}$ atm cm$^{-3}$.

In the above-mentioned structure, a silicon film which is formed typically through the plasma CVD technique or the low pressure thermal CVD technique is used for the first and second silicon films.

The reason why the predetermined crystal surface is selectively left is to conduct the crystal growth so as to produce crystal more approximating monocrystal. Leaving the predetermined crystal surface may be achieved by using etching means having a selectivity with respect to the predetermined crystal surface. For example, using an etchant resulting from mixing $H_2O$ of 63.3 wt %, KOH of 23.4 wt % and isopropanol of 13.3 wt % together, a (100) face can be selectively left, as a result of which the seed crystal covered with the (100) face can be selectively left. This is because the etching rate of the above-mentioned etchant with respect to the (100) face is lower than that of other crystal faces.

Also, a (111) face can be selectively left by etching in a gas phase using hydrazine ($N_2H_4$). Specifically, the (111) face can be left by dry etching using $ClF_3$ and $N_2H_4$ as an etching gas. This is also because the etching rate of hydrazine with respect to the (100) face is lower than that of other crystal faces.

Further, as a method of applying the energy in the above-mentioned structure, one or plural kinds of methods selected from a heating method, a laser beam irradiation method and an intense light beam irradiation method can be used simultaneously or gradually. For example, a laser beam can be irradiated while heating a laser bean can be irradiated after heating, heating and the irradiation of a laser beam can be alternately conducted, or heating can be conducted after the irradiation of a laser beam. Also, the laser beam may be replaced by an intense light beam.

In the case where the silicon film is used as a semiconductor film, and an energy is applied to the film to crystallize the silicon film, it is useful to use a metal element that promotes the crystallization of silicon. For example, when an amorphous silicon film formed by the plasma CVD technique or the low pressure thermal CVD technique is to be crystallized by heating, a heat treatment at a temperature of 600° C. or higher for 10 hours or longer is required. However, in the case of using a metal element that promotes the crystallization of silicon. the effect equal to or more than that of the above-mentioned heat treatment can be obtained by a heat treatment at 550° C. for 4 hours.

Nickel is the highest in its effect and useful as the metal element that promotes the crystallization of silicon. Also, one or plural kinds of elements selected from Fe, Co, Ru, Rh, Pd, Os, Tr, Pt, Cu and Au can be used. In particular, Fe, Pd, Pt, Cu and Au can obtain the better effect next to Ni.

A monocrystal-like region or a substantially monocrystal-like region can be formed in a predetermined region by conducting a crystal growth from the seed crystal. The monocrystal-like region or the substantially monocrystal-like region is defined as a region that satisfies conditions stated below.

No grain boundary substantially exists in the region.

A hydrogen or halogen element that neutralizes a point defect is contained at a density of 0.001 to 1 atm % in the region.

Carbon and nitrogen atoms are contained at a density of $1\times10^{16}$ to $5\times10^{18}$ atm cm$^{-3}$ in the region.

Oxygen atoms are contained at a density of $1\times10^{17}$ to $5\times10^{19}$ atm cm$^{-3}$ in the region.

Also, with the removal of the region where a seed crystal exists, the density of the metal element in the monocrystal-like region or the substantially monocrystal-like region can be set to $1\times10^{16}$ to $1\times10^{19}$ atm cm$^{-3}$, preferably $1\times10^{16}$ to $5\times10^{18}$ atm cm$^{-3}$.

The monocrystal-like region or the substantially monocrystal-like region is selectively formed, and thereafter an amorphous silicon film is formed with covering the seed crystal. Further, an energy is applied to the film by heating or irradiating a laser beam so that a crystal growth can progress from the seed crystal. Then, the monocrystal-like region or the substantially monocrystal-like region can be formed in the periphery of the seed crystal.

The monocrystal-like region or the substantially monocrystal-like region can be formed into a desired region by selecting a region where the seed crystal is formed. Hence, the thin-film semiconductor device formed using that region can be formed into the desired region.

In other words, a device equal to the device using the monocrystal silicon can be formed in a desired region. Also with the use of the operation of a metal element that promotes the crystallization of silicon or the irradiation of a laser beam or an intense light beam a glass substrate weak in heating can be used.

A plurality of semiconductor regions obtained by patterning one monocrystal-like region or substantially monocrystal-like region commonly provide the same crystal axis and rotating angle around the crystal axis, respectively. The "crystal axis" called in this example defines a crystal axis 901 which is directed perpendicularly to a plane 903 in the monocrystal-like region or the substantially monocrystal-like region in FIG. 9.

The orientation of the crystal axis can be made different depending upon a method of forming a starting film directed to the crystal axis and a crystallizing method. Specifically, a value such as a <111> axial orientation or a <100> axial orientation can be taken.

The "rotating angle around the crystal axis" defines an angle indicated by reference numeral 902 in FIG. 9. This angle is of a relative angle which is measured with a reference of an arbitrary orientation.

In the same monocrystal-like region or substantially monocrystal-like region, the crystal axes and the rotating angles therearound are identical or substantially identical to each other.

Here, that the crystal axes are identical or substantially identical to each other is defined as that its deviated angle is in a range of ±10°. Also, that the rotating angles are identical or substantially identical to each other is defined as that its deviated angle is in a range of ±10°.

Therefore, when the same monocrystal-like region or substantially monocrystal-like region is patterned to form a plurality of semiconductor regions, and a plurality of thin-film transistors are formed using those regions, the crystal axes of those active layers ale identical to each other. Similarly, the angles around the crystal axes are identical to each other.

Then utilizing the above fact plural pairs of thin-film transistors using the monocrystal-like region or substantially monocrystal-like region which commonly provide the same crystal axes and angles therearound can be formed as one group. For example, a CMOS Circuit or an invertor circuit which are constituted by the combination of a p-channel type thin-film transistor with an n-channel type thin-film transistor can be comprised of a monocrystal-like region or substantially monocrystal-like region which commonly provide the same crystal axes and anales therearound.

BRIEF DESCRIPTION OF THE DRAWINGS

The accompanying drawings, which are incorporated in and constitute a part of this specification, illustrate (an) embodiment(s) of the invention and, together with the description, serve to explain the objects, advantages and principles of the invention. In the drawings.

DETAILED DESCRIPTION OF THE PREFERRED EMBODIMENTS

Now, a description will be given in more detail of embodiments of the present invention with reference to the accompanying drawings.

(First Embodiment)

In a first embodiment, a crystalline silicon film is first formed on a glass substrate, and the crystalline silicon film is subjected to a patterning to thereby form a region that forms a seed crystal. Then, an amorphous silicon film is formed thereon and then subjected to a heat treatment, to thereby conduct a crystal growth with a seed of the seed crystal to form a monocrystal-like region or a substantially monocrystal-like region.

Hereinafter, a process of manufacturing a crystalline silicon film in accordance with this embodiment will be described with reference to FIGS. 1A to 1E. First, a silicon oxide film 102 that forms an under film is formed at a thickness of 3000 Å on a glass substrate 101 through the plasma CVD technique or the sputtering technique. The silicon oxide film 102 functions as a barrier film for preventing a moving ion from entering a semiconductor film side from the glass substrate 101 or an impurity from being diffused in the semiconductor side.

Thereafter, an amorphous silicon film 103 having a thickness of 1000 Å is formed thereon through the plasma CVD technique or the low pressure thermal CVD technique. Furthermore, a nickel film 104 is formed on the surface of the amorphous silicon film 103 through the vapor deposition technique or the sputtering technique. The thickness of nickel is set to 200 Å.

Figure 1A:
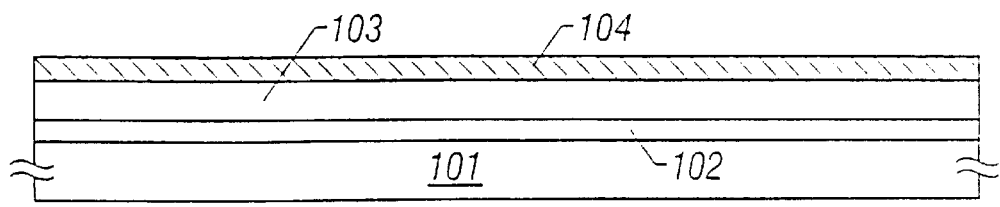
FIGS. 1A to 1E are diagrams showing a process of manufacturing a monocrystal-like region or a substantially monocrystal-like region.

After the formation of the nickel film 104, it is subjected to a heat treatment at 300 to 500° C., in this example, 450° C., for one hour, to form a nickel silicide layer on an interface between the nickel film 104 and the amorphous silicon film 103. Since the heat treatment is made for forming the nickel silicide layer, the heat treatment is conducted at a temperature of 500° C. or less where the amorphous silicon film 103 is not crystallized for about 1 to 2 hours (FIG. 1A).

Also, the irradiation of a laser beam may be substituted for the heat treatment to form the nickel silicide layer. Alternatively, the heat treatment and the irradiation of the laser beam may be used together to form the nickel silicide layer.

After the nickel silicide layer has been formed on the interface between the nickel film 104 and the amorphous silicon film 103, a heat treatment is conducted for crystallizing the amorphous silicon film 103.

This heat treatment is conducted under the conditions of 550° C. and hours. The upper limit of the conditions for the heat treatment is determined depending on a heat-resistant temperature of the glass substrate. It should be noted that the crystallization is enabled even at a temperature of about 500° C. but since it takes 10 hours or more for the treatment, the productivity is lowered.

Also, the irradiation of a laser beam or an intense light beam may be substituted for the heat treatment to crystallize the amorphous silicon film 103. It is more effective that the irradiation of a laser beam or an intense light beam and heating are conducted together. Further, it is also effective to conduct heating after the irradiation of a laser beam. Similarly, it is effective to alternately repeat the irradiation of a laser beam and heating.

The crystallization due to the above-mentioned heat process is conducted while the nickel suicide component in the nickel silicide layer is changed into a crystal nucleus. In case of applying such a method, the density of nickel in the crystalline silicon film obtained is very high (it becomes about $10^{20}$ atms cm$^{-3}$ or more), and therefore it cannot be used for a semiconductor device without any change. However, its crystalline property can be extremely enhanced.

After the crystallization due to the heat treatment has been finished, an etching is conducted using an FPM to selectively remove the nickel film 104 and the nickel silicide. The FPM is hydrofluoric acid to which over-water is added and has a function of selectively removing impurities contained in silicon. In this case, the nickel film 104 and the nickel silicide layer can be selectively removed. Also, the nickel component in the crystalline silicon film obtained can be removed.

Figure 1B:
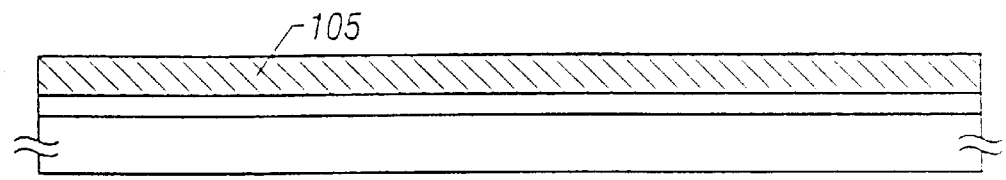

In the above-mentioned manner, a crystalline silicon film 105 is obtained. The crystalline silicon film 105 is excellent in its crystalline property, but since the density of nickel in the film 105 is high it cannot be used for a semiconductor device without any change (FIG. 1B).

Subsequently, a patterning is so conducted as to form island-like regions that form seeds 106 and 107 (hereinafter referred to as "seed crystal") of crystal growth. The island-like regions are set to a size or 0.1 to several tens μm square. It is necessary that the size of the patterning is set to 0.1 to 5 μm square, preferably 0.1 to 2 μm square. This is because the monocrystalline property of the seed crystal is obtained. In this state, an etching is further conducted by the FPM (an etchant obtained by adding over-water to hydrofluoric acid), to remove the nickel component exposed on the surface of the seed crystal.

Figure 1C:
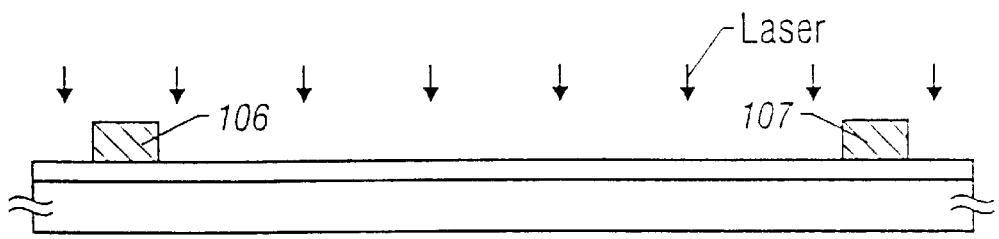
Figure 1D:
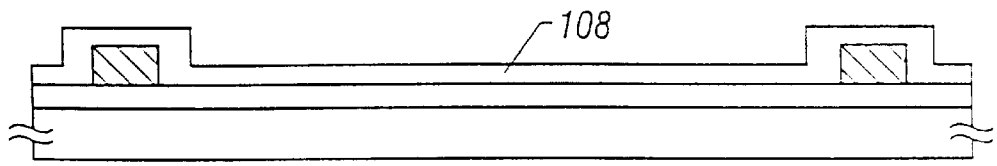
Figure 1E:
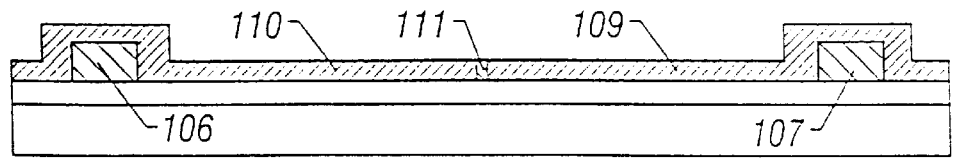

Then, a laser beam is irradiated onto those island-like regions to thereby enhance the crystalline property of those island-like regions. In this situation, since those island-like regions are of fine regions, they can be changed into monocrystal-like regions or substantially monocrystal-like regions. In this manner, the seed crystals 106 and 107 can be obtained (FIG. 1C).

In irradiating the laser beam, it is important to heat the regions to be irradiated at a temperature within a range of 450° C. to the strain point of a glass. As the temperature of the glass is higher, the resultant effect is increased. However, it is necessary to set the temperature to the strain point of the glass substrate 101 to be used, or lower from the viewpoint of the heat resistance of the glass substrate. It should be noted that, in case of using a heat-resistant material such as a quartz substrate or a semiconductor substrate as a substrate, it may be heated at a high temperature of about 800 to 1000° C. Also, the heat treatment may be conducted by a method using a heater or a method of irradiating an infrared ray or other intense light beams.

Subsequently, a chemical etching is conducted in such a manner that a crystal face having a specified orientation is left in the seed crystals 106 and 107. For example, using an etchant resulting from mixing $H_2O$ of 63.3 wt %, KOH of 23.4 wt % and isopropanol of 13.3 wt % together, a (100) face can be selectively left, as a result of which the seed crystals covered with the (100) face can be selectively left.

Also, a (111) face can be selectively left by conducting an etching in a gas phase using hydrazine ($N_2H_4$). Specifically, the (111) face can be left by dry etching using $ClF_3$ and $N_2H_4$ as an etching gas. That is, hydrazine has the highest etching rate at the (100) face. Compared with the (100) face, the etching rate at the (111) face is extremely low. The etching rates at other crystal faces are also higher than the etching rate at the (111) face. Hence, the (111) faces can be selectively left by etching using hydrazine.

The seed crystals 106 and 107 thus obtained have the nickel component removed as much as possible (however, nickel exists to the density level that adversely affects the semiconductor device) and are constituted by the monocrystal-like region or the substantially monocrystal-like region. As a result, in the crystal growth at a poststage, it can function as a nucleus of crystal growth.

Then, an aorphous silicon film 108 having thickness of 300 Å is formed entirely over the seed crystals 106 and 107. The formation of the amorphous silicon film 108 is performed through the plasma CVD technique or the low pressure thermal CVD technique. In paticular from the viewpoint of a step coverage, it is preferable to use the low pressure thermal CVD technique. Thereafter, a heat treatment is conducted to thereby crystallize the amorphous silicon film 108. In this example, a heat treatment at 600° C. for 8 hours is conducted to thereby crystallize the amorphous silicon film 108.

In this process, the crystal growth progresses with nuclei of the seed crystals 106 and 107. In this way, monocrystal-like regions or substantially monocrystal-like regions 108 and 109 are formed. In this crystal growth, the crystal face from which the seed crystals 106 and 107 are exposed grows up. For example, when the (100) face is selectively left in the seed crystals 106 and 107, the upper surfaces of the regions 110 and 109 have the (100) faces.

The crystal growth progresses toward the periphery of the seed crystals 106 and 107. Then, a grain boundary 110 is formed at a portion where the crystal growth from the seed crystal 106 and the crystal growth from the seed crystal 107 collide with each other.

Figure 2:
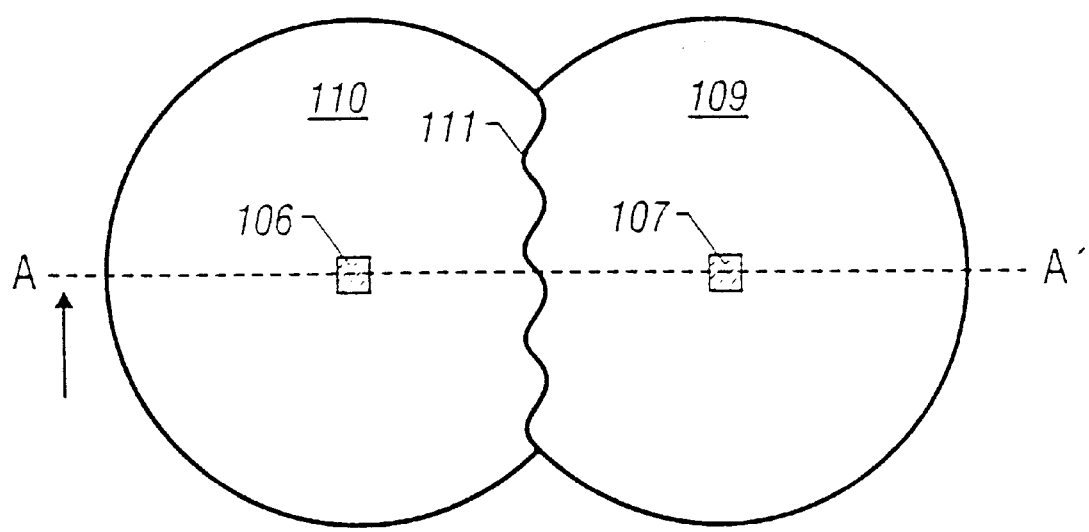
FIG. 2 is a diagram showing a state in which the monocrystal-like region or the substantially monocrystal-like region grew into a crystal.

FIG. 2 shows a state where the crystal growth is finished, taken from the top. Shown in FIG. 2 is a state in which the crystal growth progresses from the two seed crystals 106 and 107. The cross-section taken alone a line A A' of FIG. 2 corresponds to a state shown in FIG. 1E.

The monocrystal-like regions or the substantially monocrystal-like regions as indicated by reference numerals 109 or 120 in FIGS. 1A to 1E and 2 can obtain a size of several tens to several hundred μm or more.

The important matter is that a place at which the monocrystal-like region or the substantially monocrystal-like region is formed can be arbitrarily controlled by controlling a position at which the seed crystal is formed.

Finally, the portions of the seed crystals 106 and 107 are removed by etching. In this way, a process of forming the monocrystal-like region or the substantially monocrystal-like region on the glass substrate is finished. Thereafter, a variety of thin-film semiconductor devices may be formed in accordance with known processes.

In case of applying the structure shown in this embodiment, the monocrystal-like region or the substantially monocrystal-like region can be formed at an arbitrary place on the glass substrate.

The density of nickel elements in the monocrystal-like region or the substantially monocrystal-like region from which the seed crystal region has been removed (after the patterning has been conducted) can be set to $1 \times 10^{16}$ to $1 \times 10^{19}$ atms cm$^{-3}$, more preferably $1 \times 10^{16}$ to $5 \times 10^{18}$ atms cm$^{-3}$. Then, the use of this region realizes the thin-film semiconductor device which is little influenced by nickel.

(Second Embodiment)

Figure 3:
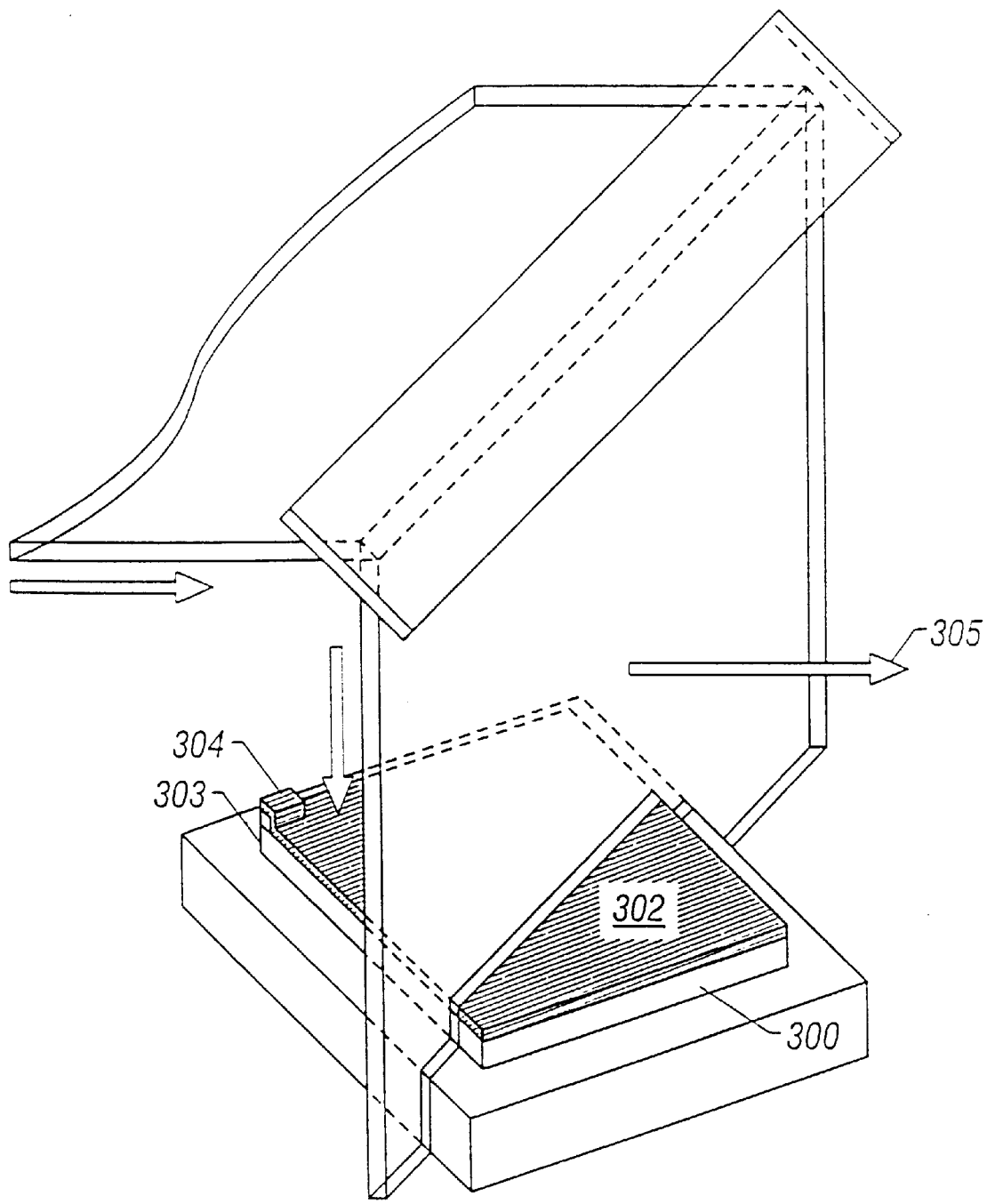
FIG. 3 is a diagram showing a process of manufacturing the monocrystal-like region or the substantially monocrystal-like region by the irradiation of a laser beam.

A second embodiment is characterized, as shown in FIG. 3, in that a linear laser beam is irradiated onto the amorphous silicon film 302 formed in the rectangular shape, starting from a corner portion 304 of the amorphous silicon film 302 while the linear laser beam is scanned thereon, to thereby conduct a crystal growth in a direction indicated by an arrow 305.

In this example, the corner portion 304 of the amorphous silicon film 302 which has been processed in the rectangular shape is formed with a seed crystal 303. In order to reap e such a state. the seed crystal 303 is first formed on the glass substrate 300 by the method described with reference to the first embodiment, and the amorphous silicon film 302 is further formed thereon. Then, the amorphous silicon film 302 is so patterned as to be formed in the rectangular shape, to thereby obtain the state shown in FIG. 3.

When a laser beam is irradiated onto the amorphous silicon film 302 in the state shown in FIG. 3, the crystal growth progresses toward a direction along which its area is gradually increased starting from the seed crystal 303. As a result, the amorphous silicon film 302 of the rectangular shape can be changed into the monocrystal-like region or the substantially monocrystal-like region.

In FIG. 3, only one amorphous silicon film 302 is shown for the simplification of description, but the amorphous silicon films 302 of the required number may be provided. However, it is important to make their directions identical to each other.

After obtaining the monocrystal-like region or the substantially monocrystal-like region, a patterning is so conducted as to form an active layer of a thin-film transistor. In this situation, it is important to remove the portion of the seed crystal 303. For example, the size of the amorphous silicon film which has been patterned in the rectangular shape and is indicated by reference numeral 302 is set to several tens to several hundred % of the active layer of the thin-film transistor as required, and after the crystallization has been finished, it is patterned into an active layer.

(Third Embodiment)

Figure 4:
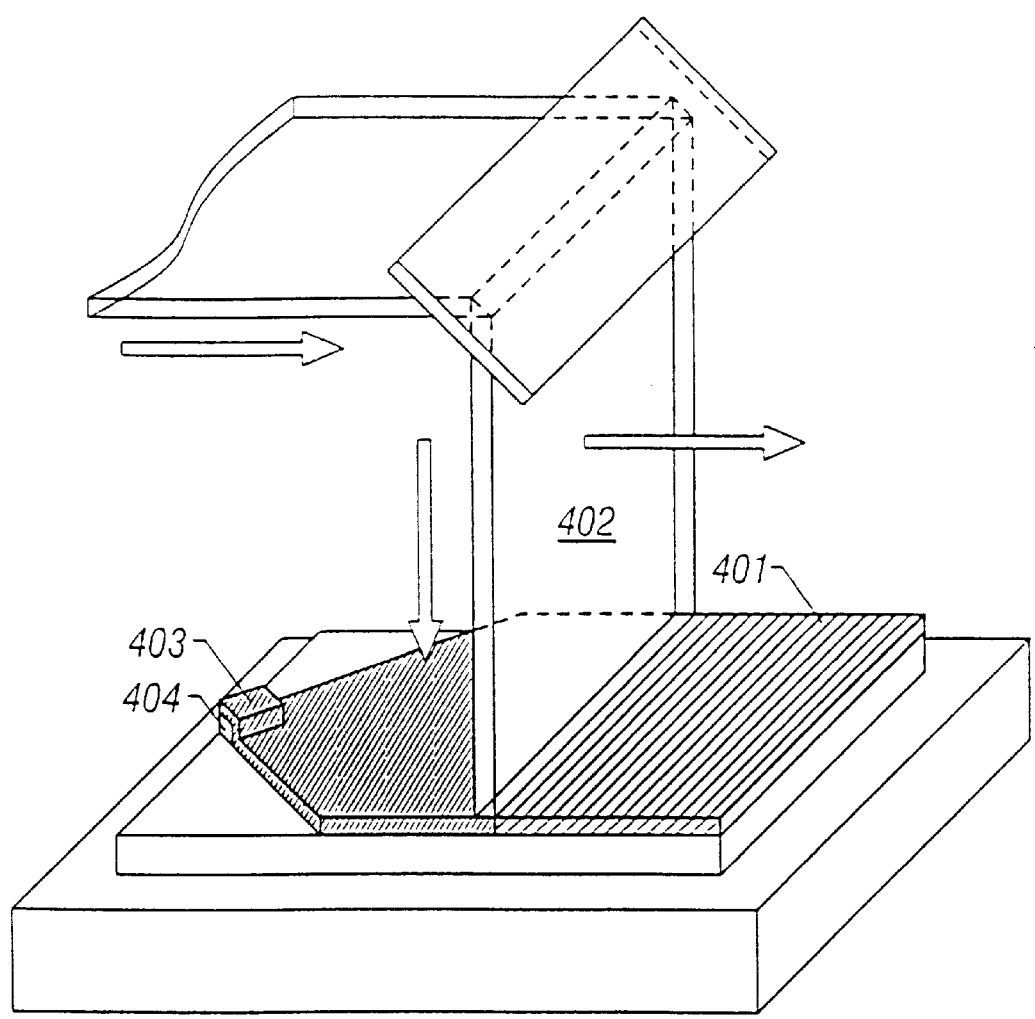
FIG. 4 is a diagram showing a process of manufacturing the monocrystal-like region or the substantially monocrystal-like region by the irradiation of a laser beam.

A third embodiment is characterized in that a linear laser beam is irradiated onto an amorphous silicon film 401 which has been processed in the shape shown in FIG. 4, starting from a corner portion 403 of the amorphous silicon film 401 while the linear laser beam is scanned thereon, whereby the amorphous silicon film 401 is changed into a monocrystal-like region or a substantially monocrystal-like region. In the state shown in FIG. 4, a seed crystal 404 is formed on the portion 403 which is a starting point from which the crystal growth starts. The method of forming the seed crystal 404 may be the one described with reference to the first embodiment.

As the laser beam is irradiated onto the amorphous silicon film 401 in the scanning manner in the state shown in FIG. 4, the crystallization progresses toward a direction along which its area is gradually increased. As a result, the entire amorphous silicon film 401 can be finally changed into the monocrystal-like region or the substantially monocrystal-like region.

After obtaining the monocrystal-like region or the substantially monocrystal-like region, a patterning is so conducted, for example, as to form an active layer of the thin-film transistor. In this situation, it is important to remove the portion of the seed crystal 404.

(Fourth Embodiment)

A fourth embodiment shows an example of forming a circuit in which a p-channel type thin-film transistor and an n-channel type thin-film transistor are constituted into a complementary type with the application of the method described in the first embodiment.

Figure 5A:
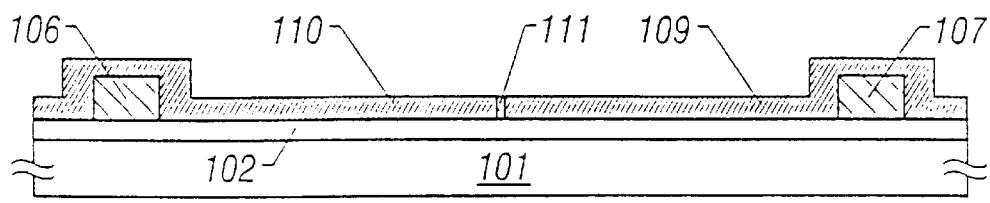
FIGS. 5A to 5D are diagrams showing a process of manufacturing a thin-film transistor using the monocrystal-like region or the substantially monocrystal-like region.
Figure 5B:
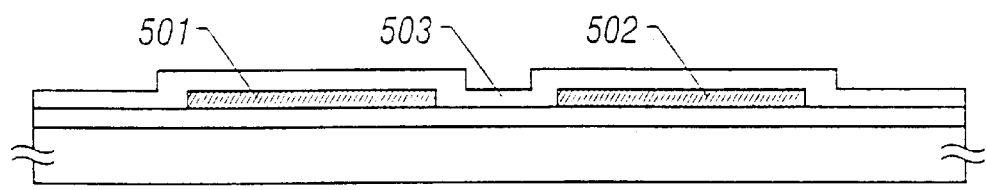

First, a state shown in FIG. 5A is obtained through the method described with reference to the first embodiment. The state shown in FIG. 5A is identical to that shown in FIG. 1E. After obtaining the state shown in FIG. 5A, a patterning is conducted to form active lasers 501 and 502 of a thin-film transistor. In this patterning process, seed crystals 106 and 107 and the region of a rain boundary 110 are removed. This is because nickel elements used in the crystallization process remain at a high density in the region of the seed crystals 106 and 107, and impurities are segregated in the grain boundary 110.

The density of nickel elements inside of a monocrystal-like region or a substantially monocrystal-like region thus obtained is $5 \times 10^{18}$ atms cm$^{-3}$ or less, and therefore there is no problem as to the existence of nickel atoms.

Figure 5C:
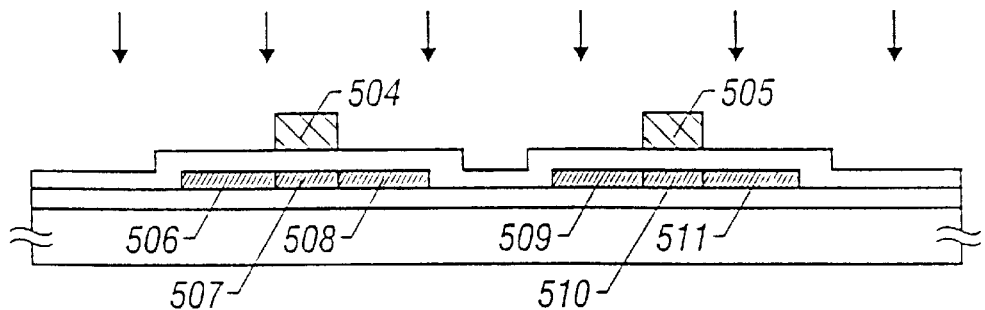

In this embodiment, a region indicated by reference numeral 501 becomes an active layer of an n-channel type thin-film transistor. Also, a region indicated by reference numeral 502 becomes an active layer of a p-channel type thin-film transistor. Subsequently, a silicon oxide film 503 that functions as a gate insulating film is formed at a thickness of 1000 Å. Furthermore, an n-type microcrystal silicon film doped with a large amount of phosphorus is formed through the low pressure thermal CVD technique and then subjected to a patterning, to thereby form gate electrodes 504 and 505 (FIG. 5C).

Further, in a state where the respective thin-film transistor regions are covered with a resist mask in that situation, phosphorus ions and boron ions are alternately implanted so that a source region 506, a drain region 508 and a channel formation region 507 of an n-channel type thin-film transistor (TFT) are formed in the self-matching fashion. Also, a source region 511, a drain region 509 and a channel formation region 510 of a p-channel type thin-film transistor (TFT) are formed in the self-matching fashion (FIG. 5C).

Figure 5D:
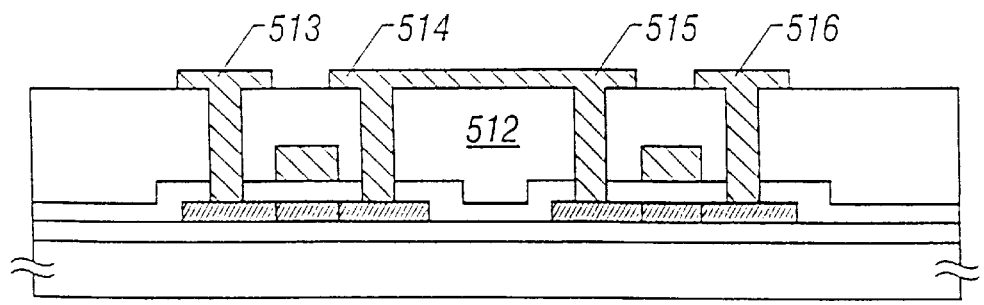

Sequentially, a silicon oxide film 512 having a thickness of 6000 Å is formed as an interlayer insulating film through the plasma CVD technique. Furthermore, contact holes are so defined as to form source electrodes 513 and 516 as well as drain electrodes 514 and 515 by double layer films consisting of a titan film and an aluminum film. In this example, the drain electrodes 514 and 515 are connected to each other to constitute a CMOS structure. In this way, a state in which the n-channel type thin-film transistor and the p-channel type thin-film transistor are constituted in the complementary type as shown in FIG. 5D is obtained.

When the structure of this embodiment is applied, since the active layers of the respective thin-film transistors can be structured by the monocrystal-like region or the substantially monocrystal-like region, it can obtain the characteristic equal to that of a transistor constituted by use of a monocrystal silicon wafer. Then, an integrated circuit constituted by the transistor using monocrystal silicon can be structured.

(Fifth Embodiment)

A fifth embodiment is a modified example of the process shown in FIG. 1. This embodiment is characterized in that, in the process shown in FIG. 1D, nickel elements are held in contact with the entire surface of the amorphous silicon film 108, and thereafter it is subjected to a heat treatment, to thereby crystallize an amorphous silicon film 108.

In order to conduct solid-phase crystallization using, a metal catalyst for the promotion of crystallization, several methods are proposed.

As one method thereof, in the case of a "physical formation" in which a coating of metal catalyst (Ni, Fe, Ru, Rn, Os, Ir, Pt, Cu. Au. etc.) is formed through the sputtering technique, the electron been vapor deposition technique, etc., even though a mean thickness of the metal coating is set to 5 to 200 Å. for example. 10 to 50 Å, the catalyst is liable to be formed on a surface to be formed in the form of an island.

In other words, the metal catalyst becomes fine particles. a mean diameter of which is 50 to 200 Å, and is liable to be dispersed. Also, intervals between the respective fine particles are about 100 to 1000 Å. In other words, this causes a discontinuous layer to be formed and makes it hard to form a continuous film.

The metal islands form a nucleus of crystallization. from which the crystal growth of the amorphous silicon film on the insulating layer is conducted through a heat treatment at 450 to 600° C.

In the above-mentioned technique, a temperature under crystallization can be lowered by at least 50 to 100° C. in comparison with a temperature when the crystallization is conducted without any use of the above-mentioned catalyst. However, it has been found as a result of carefully observing the crystallized coating that a very large amount of amorphous components remain and form a metal region having a metal property. It is supposed that the metal nuclei have remained as they were.

The metal region acts as a recombination center of electrons and holes in a semiconductor region which has been crystallized. The metal region has such a very adverse characteristic that, when a reverse bias voltage is applied across a semiconductor device, in particular, a semiconductor device having the p-i and n-i junctions, the metal region that almost airways exists in -the semiconductor region having the p-i and n-i junctions makes a leak current increase.

For example, in the case of the structure of a TFT of the thin-film type having a channel length/channel width=8 $\mu$m /8 $\mu$m, an off-state current which should be naturally about $10^{-12}$ A is increased to $10^{-10}$ to $10^{-6}$ A, that is $10^2$ to $10^6$ times as large as the former.

In order to eliminate the above-mentioned drawback, this embodiment provides a "chemical formation" method as a method of forming a metal catalyst coating.

In this method, a metal compound which has been diluted with a solution (water, isopropyl alcohol, etc.) at a density of 1 to 1000 ppm, typically 10 to 100 ppm is used. In particular, an organometal compound is used.

Hereinafter, various examples of metal compounds available to the chemical formation method will be described.

(1) In Case of Using Ni as a Catalyst Element

At lease one kind of nickel compound selected from nickel bromide, nickel acetate, nickel oxalate, nickel carbonate, nickel chloride, nickel iodide, nickel nitrate, nickel sulfate, nickel formate, nickel oxide, nickel hydroxide, nickel acetylacetonate, nickel 4-cyclohexyl butyrate, and nickel 2-ethyl hexanoic acid can be used.

Also, Ni may be mixed with at least one selected from benzene, toluene xylene, carbon tetrachloride, chloroform, ether, trichloroethylene, and freon, all of which are a non-polar solvent.

(2) In Case of Using Fe (iron) as a Catalyst Element

A material known as ion salt, for example, bromide ($FeBr_26H_2O$), iron (II) bromide ($FeBr_3$ $6H_2O$), iron (II) acetate ($Fe(C_2H_3O_2)_3xH_2O$), iron (I) chloride ($FeCl_2$ $4H_2O$), iron (II) chloride ($FeCl_3$ $6H_2O$), iron (II) fluoride ($FeF_3$ $3H_2O$), iron (II) nitrate ($Fe(NO_3)$ $9H_2O$), iron (I) phosphorate ($Fe_3(PO_4)_28H_2O$), and iron (II) phosphorate ($FePO_48H_2O$) can be selectively used.

(3) In Case of Using Co (Cobalt) as a Catalyst Element

A cobalt compound is selected from a material known as a cobalt salt, for example, cobalt bromide ($CoBr$ $6H_2O$), cobalt acetate ($Co(C_2H_3O_2)_24H_2O$), cobalt chloride ($CoCl_2$ $6H_2O$), cobalt fluoride ($CoF_2Xh_2O$), and cobalt nitrate ($Co(No_3)_2$ $6H_2O$), and can be use.

(4) In Case of Using Ru (Ruthenium) as a Catalyst Element

As a ruthenium compound, a material known as ruthenium salt, for example, ruthenium chloride ($RuCl_3H_2O$) can be used.

(5) In Case of Using Rh (Rhodium) as a Catalyst Element

As a rhodium compound, a material known as rhodium salt, for example, rhodium chloride ($RhCl_3$ $3H_2O$) can be used.

(6) In Case of Using Pd (Palladium) as a Catalyst Element

As a palladium compound, a material known as palladium salt, for example, palladium chloride can be used.

(7) In Case of Using Os (Osmium) as a Catalyst Element

As an osmium compound, a material known as osmium salt, for example, osmium chloride ($OsCl_3$) can be used.

(8) In Case of Using Ir (Iridium) as a Catalyst Element

As an iridium compound, a material known as iridium salt, for example, a material selected from iridium trichloride ($IrCl_3$ $3H_2O$) and indium tetrachloride ($IrCl_4$) can be used.

(9) In Case of Using Pt (Platinum) as a Catalyst Element

As a platinum compound, a material known as platinum salt, for example, platinum (II) chloride ($PtCl_4$ $5H_2O$) can be used.

(10) In Case of Using Cu (Copper) as a Catalyst Element

As a copper compound, a material selected from copper (II) acetate ($Cu(CH_3COO)_2$), copper (II) chloride ($CuCl_22H_2O$) and copper (II) nitrate ($Cu(NO_3)_2$ $3H_2O$) can be used.

(11) In Case of Using Gold as a Catalyst Element

As a gold compound, a material selected from sold trichloride ($AuCl_3Xh_2O$), gold nitride ($AuHCl_4$ $4H_2O$) and sodium tetrachloroaurate ($AuNaCl_4$ $2H_2O$) can be used.

Each of the above materials can be sufficiently dispersed into a monomolecule in the solvent.

The solvent droplets are dropped on a surface to be formed, to which a catalyst is to be added, rotated at a speed of 50 to 500 revolutions/min (RPM), and is spin-coated. As a result, the solvent can be spread over the entire surface.

In this situation, in order to promote the uniform wetting property of the surface of the silicon semiconductor, if a silicon oxide film having a thickness of 5 to 100 Å is formed on the surface of the silicon semiconductor, the solvent can be sufficiently prevented from existing in the form of points on the surface thereof by means of the surface tension of liquid.

Also, when an interfacial active agent is added to liquid, a good uniform wetting state can be obtained even on the silicon semiconductor having no silicon oxide film.

Those methods enable the metal catalyst to be dispersed into the semiconductor through the oxide film in the form of atoms, and in particular, they enable the metal catalyst to be dispersed to conduct crystallization without positively making the crystal nucleus (particle-shaped). Thus, the above methods are preferable.

Also, an organometal compound is uniformly coated on the silicon semiconductor and then subjected to an ozone processing (ultraviolet ravs (UV) in oxygen), to form a metal oxide film. The metal oxide film comes in a starting state of crystallization. As a result, because an organic substance is oxidized and can be gasified and removed as a carbon dioxide gas, a more uniform solid-phase growth can be made.

Also, when the spin coating is conducted only at a low-speed rotation, the metal components in the solvent, which exists on the surface is liable to be supplied to the semiconductor film by an amount more than that as required for the solid-phase growth. For that reason, after the spin coating has been made at the low-speed rotation, a substrate is rotated at 1000 to 10000 rpm, typically 2000 to 5000 rpm. Then, all the excessive organometal is shook off outwardly so as to be removed, and simultaneously the surface can be satisfactorily dried. Also, it is effective to fix the amount of the organometal existing on the surface.

The chemical formation method as described above enables a continuous layer to be formed without making a nucleus due to the metal particles for crystallization on the surface of the semiconductor.

The physical formation is liable to form an inhomogeneous layer whereas the chemical formation extremely readily forms a homogeneous-layer.

Using the above-mentioned technical concept, when thermal crystallization is to be conducted at 450 to 650° C., the crystal growth can be extremely uniformly made over all the surface.

As a result, even though a reverse bias voltage is applied across a semiconductor having the p-i and n-i junctions which has been formed using a semiconductor film which has been crystallized through that chemical formation method, its leak current can be restrained to a level of $10^{-12}$ A at most of the semiconductor.

In the physical formation method, there is a case where 90 to 100 per 100 p-i junctions have a leak current of $10^{-10}$ to $10^{-5}$ A, and 50 to 70 per 100 n-i junctions have a large leak current of $10^{-12}$ to $10^{-6}$ A.

On the other hand, in the chemical formation method, 5 to 20 per 100 p-i junctions have a leak current of $10^{-13}$ to $10^{-3}$ A, and 0 to 5 per 100 n-i junctions have a leak current of $10^{-13}$ to $10^{-3}$ A. Thus, the characteristics are remarkably improved such that the off-state current is decreased, and a film causing a large leak current is reduced.

Also, when a semiconductor film is formed on the insulating surface to form a TFT, even though the TFT is of the p-channel TFT (p-i-p) type or the n-channel TFT (n-i-n) type, the same remarkable excellent effects can be obtained.

Furthermore, that off-state current allows the existing probability of the TFTs having a large leak current to be lowered by about 1 to 2 figures in comparison with the physical formation method.

However, in order to form a thin-film integrated circuit by using this TFT, the existing probability of the TFTs having a large leak current is required to be $1/10^3$ to $1/10^9$.

Also, after the thermal crystallization has been conducted with the addition of a catalyst metal through the above-mentioned chemical formation method, a laser beam of 248 mm or 308 mm is irradiated onto its surface with the intensity of 250 to 400 mJ/cm$^2$. Then, a light absorption to a laser beam is large particularly in a region having a large amount of metal components in comparison with the silicon film which has been crystallized. In other words, this is because a region remaining in the form of the amorphous structure such as a metal becomes black optically. On the other hand, the crystal component is transparent.

For that reason, the amorphous silicon component that slightly remains is selectively melted by the irradiation of a laser beam so that the metal components are diffused so as to be re-crystallized. The metal existing in that region can be diffused into an atom level unit.

As a result, the existing probability of the metal region can be further decreased in the coating film thus formed, and an increase in the leak current, which is caused when the metal region comes to the recombination center of electrons and holes, is eliminated with the results that the off-state current at the n-i junction and the p-i junction of the TFT is $10^{-13}$ to $10^{-12}$ A which is decreased by about 1 to 2 figures, and the number of TFTs having a large leak current can be reduced to 1 to 3 per $10^4$ to $10^8$ TFTs.

In this way, the reverse leak current, that is, $I_{off}$ is lowered by 2 figures, and the existing probability of TFTs having a large leak current can be decreased by 2 figures at the maximum. It is assumed that a cause of allowing TFTs having a large leak current to still exist is that dusts are attached onto the surface of the semiconductor and organometal concentrates at that portion, and an improvement in those characteristics can be recognized because of an improvement in the performance of experimental devices.

Also, in the physical formation method, as a result of attempting an experiment on the irradiation of a laser beam on a thermally crystallized film, there was a case where, because metal particles in the starting film become increased in size too large, even though the semiconductor is melted by the irradiation of a laser beam and recrystallized, an off-state current when a reverse bias is applied at the p-i and n-i junctions could not be reduced at all.

In view of the above, the chemical formation of a continuous layer using a metal catalyst, the thermally crystallizing method accompanied by that formation and a semiconductor device formed by using such a method can readily obtain more excellent effects than the physical formation of a discontinuous layer using a metal catalyst and the thermal crystallizing method accompanied by that formation.

One type of the chemical methods is a method of forming a metal compound, in particular, an organometal compound gas on a surface to be formed through the CVD technique instead fusing light.

This method, as in the method using a liquid, has a remarkable effect in the reduction of an off-state current and the reduction of the existing probability of TFTs having a large leak current.

Also, the physical formation method is liable to become nonuniform "anisotropic crystal growth" using a metal nucleus whereas the chemical formation method is comparatively easier to obtain a uniform crystal growth of "isotropic growth" using a uniform metal catalyst.

The chemical method is of one type in which the crystal growth is made in a lateral direction with respect to the substrate surface, and of the other type in which the crystal grows vertically on the substrate surface, from the lower side toward se upper side or the semiconductor or from the upper side toward the lower side thereof, to thereby being capable of obtaining an excellent electric characteristic of the semiconductor.

In order to hold the surface of the amorphous silicon film 108 in contact with nickel elements, as described above, a solvent containing a nickel element therein is coated on the surface of the amorphous silicon film 108, and an excessive solvent is removed by a spinner. In this example, a nickel acetate solvent is used as a solvent.

With the application of the structure described in this embodiment, a temperature required for crystallization can be lowered, and its period of time can be reduced. Specifically, in the structure shown in the first embodiment, a heat treatment for 8 hours or longer is required under the heat atmosphere of 600° C. However, in the case of using nickel elements, the amorphous silicon film 108 can be crystallized under the condition where the heat treatment is conducted for 4 hours at 550° C.

However, in the case where the structure described in this embodiment is applied, the density of the metal element in the obtained monocrystal-like region or substantially monocrystal-like region becomes high. Hence, unless attention is given to the density of the introduced metal element, the characteristic of the obtained device is adversely affected by the metal element.

Specifically, thee density of the finally remaining, metal elements must be set to be $1\times10^{19}$ atms cm$^{-3}$ or less. The adjustment of this density can be performed by adjusting the density of nickel in the solvent. It should be noted that the crystallization promoting action cannot be obtained when the density of the metal element that remains in the silicon film when crystallizing is $1\times10_{16}$ atm cm$_3$ or less Hence, the amount of metal elements to be introduced must be adjusted so that the metal elements exist in the silicon film at the density of $1\times10^{16}$ to $1\times10^{19}$ atm cm$^{-3}$.

(Sixth Embodiment)

A sixth embodiment shows an example of obtaining a monocrystal-like region or substantially monocrystal-like region having a face orientation of its upper surface being the (100) face, using a seed crystal having a face orientation of a (100) face.

Figure 6A:
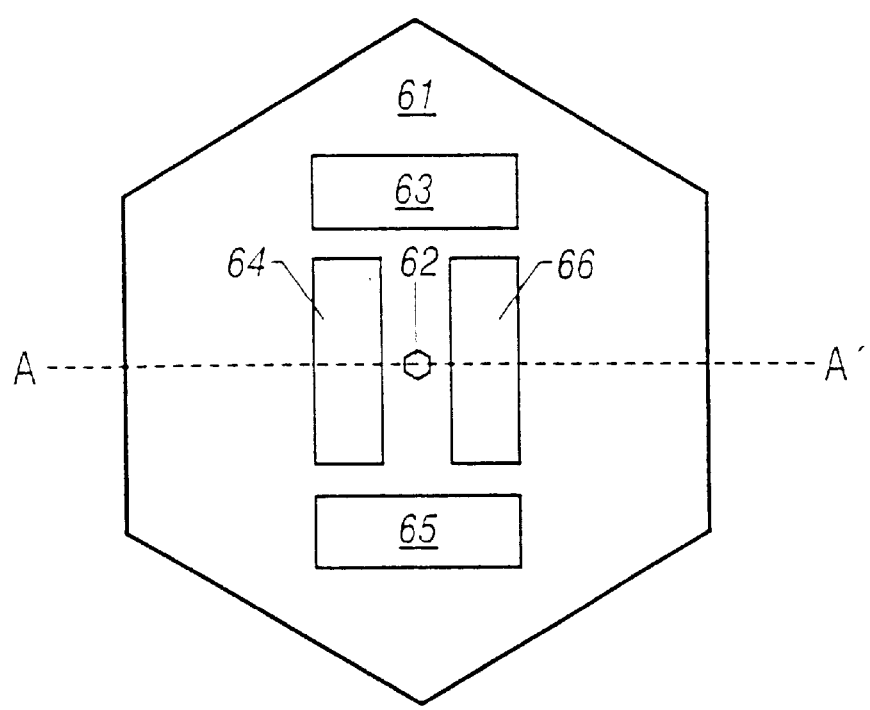
FIGS. 6A to 6C are diagrams showing a process of manufacturing the monocrystal-like region or the substantially monocrystal-like region.
Figure 6B:
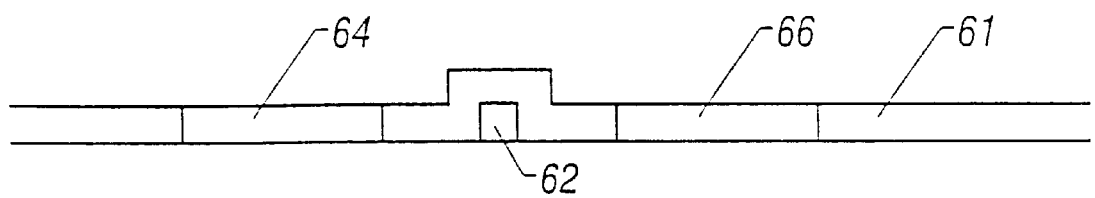
Figure 6C:

FIG. 6 shows a state in which a monocrystal-like region or substantially monocrystal-like region is formed. In FIG. 6, reference numeral 62 denotes a seed crystal, and 61 is a monocrystal-like region or substantially monocrystal-like region which has been obtained by the crystal growth from the seed crystal 62. Also, a section taken along a line A–A' in FIG. 6A is shown in FIG. 6B.

The monocrystal-like region or substantially monocrystal-like region 61 shown in FIG. 6 is obtained as a substantially hexagonal region.

A manufacturing process through which the state shown in FIG. 6 is obtained will be described. First, a silicon oxide film is formed on a glass substrate as an under layer (not shown), and an amorphous silicon film (not shown) is formed thereon. Then, the amorphous silicon film is crystallized through the same method as that in the first embodiment. In other words, nickel suicide which is a metal element that promotes the crystallization of silicon is formed on the amorphous silicon film, and then subjected to a heat treatment to crystallize the amorphous icon film. Further, the morphous silicon film is subjected to a patterning to form a base of the seed crystal 62. Thereafter, a laser beam is irradiated onto the amorphous silicon film while the silicon film beings heated at 450 to 600° C. (The upper limit of this temperature is determined by a strain point of the glass substrate.), to thereby obtain the seed crystal.

Thereafter, the amorphous silicon film is formed on the seed crystal 62 and subjected to a predetermined heat treatment, thereby being capable of obtaining the monocrystal-like region or substantially monocrystal-like region 61. This state is shown in FIGS. 6A and 6B.

Subsequently, portions of the seed crystal 62 and unnecessary portions are removed to thereby obtain active layers 64 and 66 which are formed by the monocrystal-like region or substantially monocrystal-like region. In this example, the seed crystal 62 contains a metal element (in this example, nickel) that promotes the crystallization of silicon as described in the first embodiment at a high density. Accordingly, by conducting the above-mentioned patterning the characteristics of a manufactured device can be prevented from gradually fluctuating or being deteriorated by an influence of nickel. In this way, the state shown in FIG. 6C can be obtained.

With the above process, as indicated by reference numerals 63 to 66 in FIG. 6A, the active layers which are formed by the monocrystal-like region or substantially monocrystal-like region can be obtained. In the post-stage, a thin-film transistor may be manufactured by using those active layers 63 to 66.

(Seventh Embodiment)

A seventh embodiment shows an example in which this invention described in this specification is applied to the active matrix liquid-crystal display unit having such a structure that even a peripheral circuit is integrated. FIG. 7 shows the structure of an outline of this embodiment.

Figure 7A:
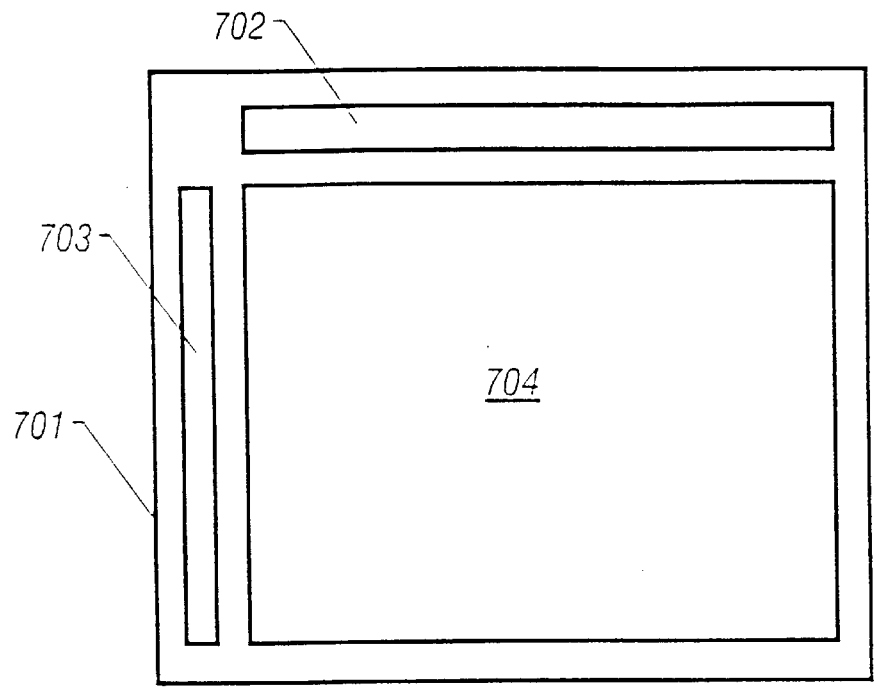
FIGS. 7A and 7B are diagrams showing a structure of an active matrix type liquid-crystal display unit.

FIG. 7A shows peripheral circuits 702 and 703 formed on a glass substrate 701 and a pixel region 704 disposed in the form of a matrix which is driven by the peripheral circuit. In order to constitute the liquid-crystal display unit, paired glass substrates on which opposing electrodes are formed is prepared and bonded to a substrate shown in FIG. 7A so that liquid crystal is sealed therebetween to provide a liquid-crystal display unit.

In the structure shown in FIG. 7A, the peripheral circuit is constituted by a thin-film transistor that includes the monocrystal-like region or substantially monocrystal-like region, and a thin-film transistor using an amorphous silicon film is disposed in a pixel region. The reason why an amorphous silicon film is used for the thin-film transistor disposed in the pixel region is that the practicability can be sufficiently obtained even by the thin-film transistor using an amorphous silicon film as a performance of the transistor for controlling the take-in and take-out of charges to/from the pixel electrode. In particular, in the case of a TN-type liquid crystal which is frequently used under existing circumstances, in the thin-film transistor which is formed by a silicon thin film having a crystalline property equal to that of monocrystal, the operating speed of a transistor is too high in comparison with the response speed of liquid crystal, resulting in a poor operating stability. Hence, such a structure that the peripheral circuit being capable of performing a high-speed operation is constituted by the thin-film transistor equivalent to the thin-film transistor using monocrystal silicon. and the thin-film transistor disposed in the pixel region is constituted by an amorphous silicon film is high in the practibility.

Figure 7B:
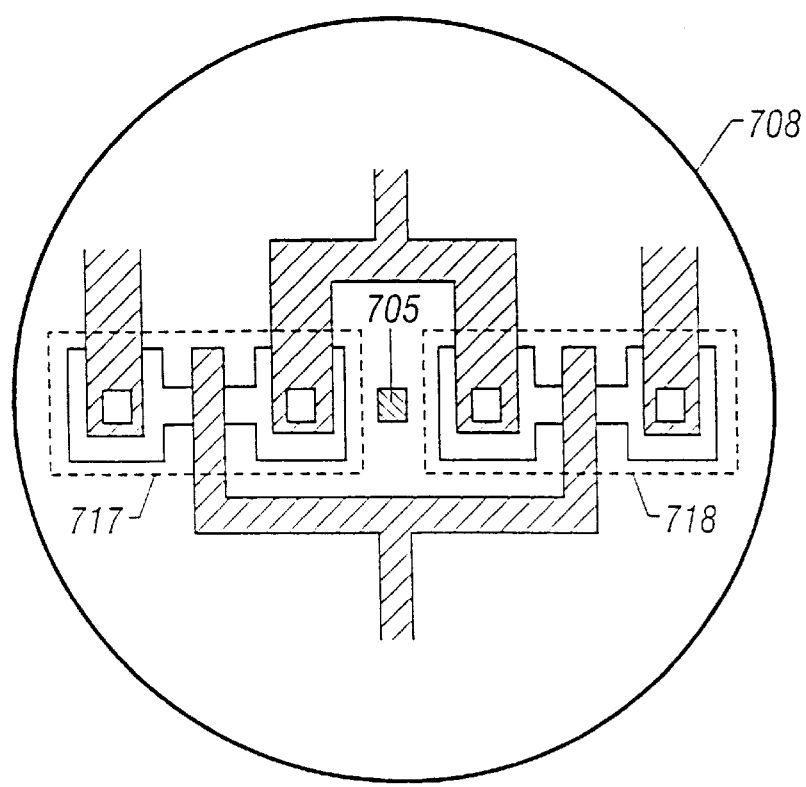

A diagram partially enlarging the peripheral circuit 702 or 703 shown in FIG. 7A is shown in FIG. 7B. What is shown in FIG. 7B is an invertor circuit constituting a part of the peripheral circuit 702 of 703. Actually, a complicated integrated circuit is comprised of such an invertor and other required structures. It should be noted that the peripheral circuit 702 or 703 mentioned in this example defines a circuit including at least one selected from a circuit for driving a thin-film transistor and a shift register which are disposed in a pixel region, a variety of control circuits, a circuit that deals with a video signal, etc.

In FIG. 7B, what is indicated by reference numeral 705 is a seed crystal, and the monocrystal-like region or substantially monocrystal-like region as indicated by reference numeral 708 is formed on the basis of the seed crystal 705. It should be noted that the monocrystal-like region or substantially monocrystal-like region 708 is patterned in a required pattern into a state where the seed crystal 705 is removed therefrom at a stage where the thin-film transistor is formed.

FIG. 7B shows an example in which the n-channel thin-film transistor 717 and the p-channel transistor 718 are constituted by using the monocrystal-like region or substantially monocrystal-like region 708, and an invertor circuit is constituted by those thin-film, transistors.

In the figure, there is shown an example of forming two thin-film transistors consisting of the n-channel thin-film transistor and the p-channel thin-film transistor in the monocrystal-like region or substantially monocrystal-like reunion 708 However, the thin-film transistors in the monocrystal-like region or substantially monocrystal-like region 708 may be formed in the required numbers or the possible numbers.

Hereinafter, a process of manufacturing the structure shown in FIG. 7 will be described with reference to FIG. 8. What is shown in FIG. 8 is a process of manufacturing an invertor circuit formed in the peripheral region and a thin-film transistor which is connected to a pixel electrode formed in a pixel region. In this embodiment, the thin-film transistor forming the peripheral region is constituted by using the monocrystal-like region or substantially monocrystal-like region. Also, the thin-film transistor arranged in the pixel region is constituted by a thin-film transistor using an amorphous silicon film.

First, a silicon oxide film 802 having a thickness of 3000 Å is formed on a glass substrate 801. The glass substrate 801, constitutes one of a pair of glass substrates that form a liquid-crystal display unit. Then, a seed crystal 803 is formed through the method described with reference to the first embodiment. Moreover, an amorphous silicon film 804 having a thickness of 500 Å is formed thereon (FIG. 8A).

Subsequently, the monocrystal-like region or substantially monocrystal-like region is formed in the periphery of the seed crystal 803 by conducting a heat treatment and the irradiation of a laser beam together. In this example, a laser beam is irradiated onto only a region of the peripheral circuit by using an excimer laser beam of several cm². In the irradiation of the laser beam, a heating temperature is set to 600° C. Even though heating is conducted for a short period of time (the laser beam is irradiated for several minutes) at a temperature of 600° C. since the amorphous silicon film is not crystallized, the amorphous silicon film 804 in the pixel region is not crystallized. This heating temperature is preferably as high as possible in a range where the glass substrate is not damaged. Also, in this example, a heating method in which infrared rays are irradiated is used in order to heat a silicon film for a short period of time.

Figure 8A:
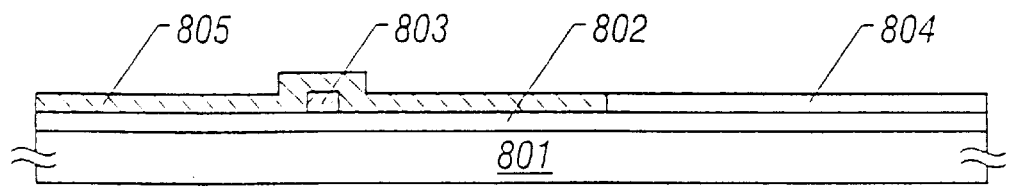
FIGS. 8A to 8D are diagrams showing a process of simultaneously forming a thin-film transistor of a peripheral circuit and a thin-film transistor in a pixel region in the active matrix type liquid-crystal display unit.

In this way, a region indicated by oblique lines in FIG. 8A can be changed into the monocrystal-like region or substantially monocrystal-like region. Also, in this state, a region except for that region indicated by the oblique lines is left in the state of the amorphous silicon film 804 as it is.

Subsequently, active layers 806 and 807 of the thin-film transistor disposed in the peripheral circuit are formed by patterning. Simultaneously, an active layer 808 of the thin-film transistor connected to the pixel electrode is formed thereon. In this state, the active layers 806 and 807 are constituted by the monocrystal-like region or substantially monocrystal-like region 805. Also, the active layer 808 is constituted by an amorphous silicon film 804.

Figure 8B:
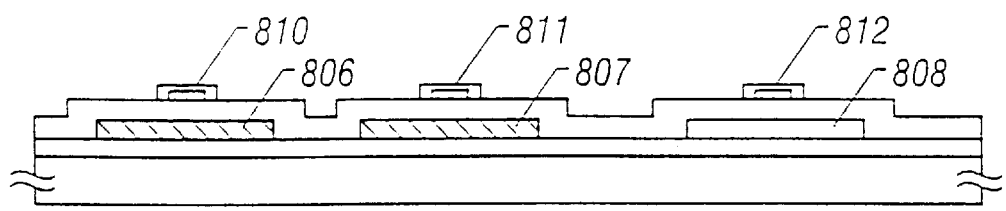

Then, a silicon oxide film 809 that functions as a gate insulating film is formed at a thickness of 1000 Å. Thereafter, an aluminum film containing scandium of 0.2 wt % and having a thickness of 6000 Å is formed through the sputtering technique or the electron beam vapor deposition technique and patterned to form gate electrodes 810, 811 and 812. Further, anodic oxidation is conducted with those date electrodes 810 to 812 as anodes in an electrolyte, to thereby form an anodic oxidation film in the periphery of ate electrodes 810 to 812. Thus, a state shown in FIG. 8B is obtained.

First, a region in which the n-channel thin-film transistor is to be formed is masked by a resist mask 800, and B (boron) ions which are impurities giving the p-type to silicon are implanted thereinto. The implantation of ions is conducted through the ion implantation technique or the plasma doping technique. Further, a region in which a p-channel thin-film transistor is to be formed is covered with a resist mask (not shown) and P ions are implanted thereinto. After those ion implantation processes have been completed, the activation of implanted ions and the annealing of damages accompanied by the implantation of ions are conducted by the irradiation of a laser beam (not shown).

Figure 8C:
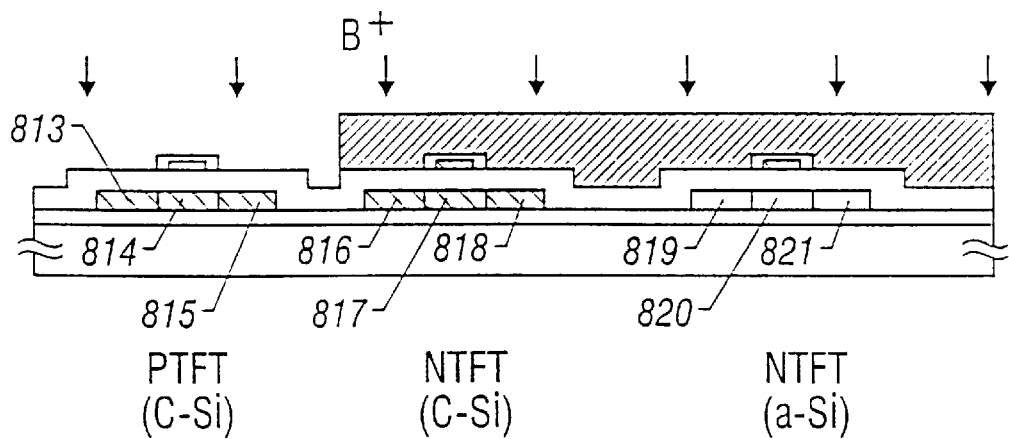

In the above-mentioned manner, as shown in FIG. 8C, a source region 813, a drain region 815 and a channel formation region 814 of the p-channel thin-film transistor (PTFT) are formed. Also, a source region 818, a drain region 816 and a channel formation region 817 of the n-channel thin-film transistor (NTFT) are formed. These two thin-film transistors are disposed in the periphery of the peripheral circuit and constituted by a region (C—Si) an active layer of which is the monocrystal-like region or substantially monocrystal-like region.

Also, a source region 819, a drain region 821 and a channel formation region 820 of a thin-film transistor disposed in the pixel region are simultaneously formed. The thin-film transistor disposed in this pixel region is formed of an amorphous silicon film (a-Si.).

A process of forming those source and drain regions and the channel formation region by implanting impurity ions is conducted in the self-matching manner.

After the source, the drain and the channel formation regions of each thin-film transistor have been formed, a silicon oxide film 822 having a thickness of 6000 Å is formed as an interlayer insulating film through the plasma CVD technique. Furthermore, contact holes are formed so that a source electrode 823 of the p-channel thin-film transistor disposed in the peripheral circuit region, a drain electrode 824 common to the p-channel thin-film transistor and the n-channel thin-film transistor, and a source electrode 825 of the n-channel thin-film transistor are formed. Simultaneously, a source electrode 826 and a drain electrode 827 of the n-channel thin-film transistor disposed in the pixel region are formed. Those electrodes 823 to 827 are constituted by a three-layer structure where an aluminum film is interposed between two titan films.

Furthermore, an ITO electrode 828 constituting a pixel electrode is formed. In this way, the thin-film transistor that constitutes a peripheral circuit formed by using the monocrystal-like region and a thin-film transistor using an amorphous silicon film and disposed in the pixel region can be simultaneously formed on the same glass substrate. In this manner, one substrate constituting the active matrix liquid-crystal display unit shown in FIG. 7 is completed. The structure thus obtained can be regarded as two thin-film transistors being formed as one pair by using a seed crystal 805.

Figure 8D:
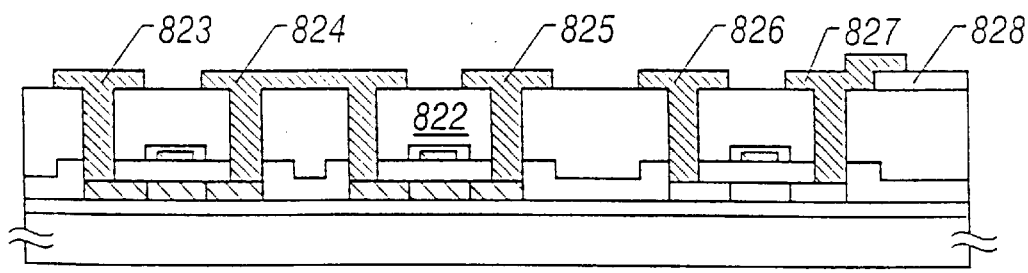
Figure 9:
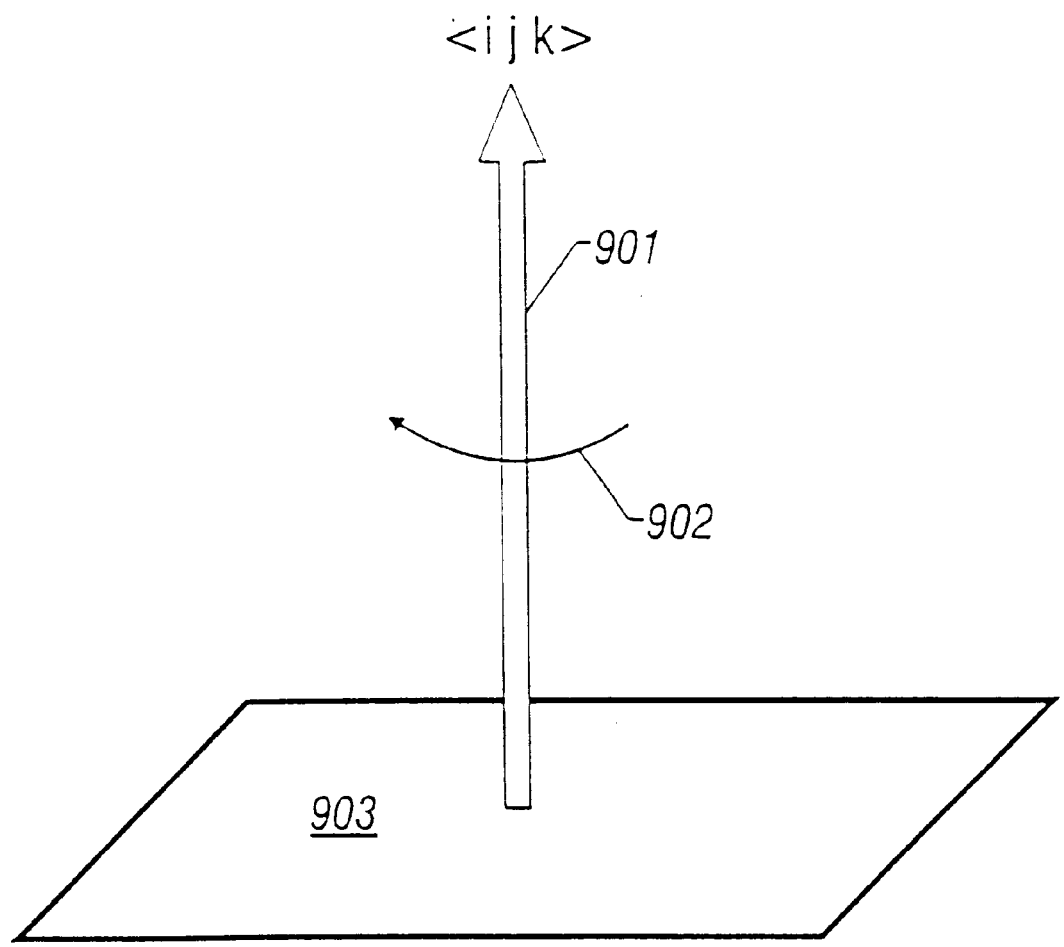
FIG. 9 is a diagram for defining a crystal axis and a rotating angle with a center of the crystal axis.

After the state shown in FIG. 8D has been obtained, a second interlayer insulating film is further formed, and an oriented film is formed on that film. Then, an opposing electrode is formed on each of opposing glass substrates, and an oriented film is formed on the opposing electrode, likewise. Thereafter, an orientation process is conducted, and the paired glass substrates thus manufactured is bonded to each other. Finally, liquid crystal is sealed between the paired glass substrates thus bonded, to thereby complete the active matrix liquid-crystal display unit panel.

The liquid-crystal display unit described in this embodiment has such a structure that the peripheral circuits are integrated and therefore can be so structured as to be very compact and light-weighted.

In this embodiment, as shown in FIG. 8, there is shown an example in which the paired thin-film transistors of the n-channel type and the p-channel type are formed by using the seed crystal 805 and constituted into the complemental type. However, this may be of a pair of thin-film transistors of the same channel type. Also, a pair of thin-film transistors of the n-channel type and the p-channel type may be formed and independently operated.

(Eighth Embodiment)

An eighth embodiment shows an example in which a pixel region 704 is of the passive type using no thin-film transistor, and only peripheral circuits 702 and 703 are constituted by a monocrystal-like crystalline silicon film region or substantially monocrystal-like crystalline silicon film region shown in FIG. 7B, in the structure shown in FIG. 7A.

Unless a complicated image information display is not conducted, there has been known that a known STN-type liquid-crystal display unit can be satisfactorily practically used. For example, the STN-type liquid-crystal display unit is used for a portable information device (a note-type word processor or personal computer) which is required to display only characters numerals and simple figures. However, under the existing circumstances, an IC attached externally is used for the peripheral circuit disposed in the periphery of the pixel region.

In case of using the externally attached IC circuit, the thickness of a liquid-crystal panel is thickened. and its weight is also heavy. From this viewpoint, in the structure described in this embodiment, only the peripheral circuit is constituted by the circuit shown in FIG. 7B. to thereby integrate the liquid-crystal layer and the peripheral circuit on the glass substrate. With this structure, a liquid-crystal layer, an electrode and a wire applied to that liquid-crystal layer can be integrated between a pair of glass substrates, and further, the peripheral circuits indicated by reference numerals 702 and 703 in FIG. 7A can be integrated in the periphery of the liquid-crystal layer. Also, since the peripheral circuits 702 and 703 are integrated in a region a width of which is several mm, the entire structure can be made very compact.

As was described above, according to the present invention, a region that forms a seed crystal is selectively formed, whereby the monocrystal-like crystalline silicon film region or substantially monocrystal-like crystalline silicon film region can be formed in an arbitrary region. Also, this region can be formed on the glass substrate. In case of using the present invention described in this specification. such a structure that the peripheral circuits of the active matrix liquid-crystal display unit are integrated on the glass substrate can be realized. In particular, the thin-film transistor constituting at least one of the peripheral circuits can provide the characteristics equivalent to that using a monocrystal silicon, that can contribute to the further weight-lightening and film-thinning of the thin-film transistor. The present invention described in this specification can be applied to a photoelectric conversion unit, a photosensor and a pressure sensor using a thin-film diode or a thin-film semiconductor, other than the thin-film transistor.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising:
   at least two thin film transistors formed over a substrate, each of said two thin film transistors having a crystalline semiconductor film comprising silicon formed on an insulating surface as an active region thereof,
   wherein said crystalline semiconductor film of each of said two thin film transistors has substantially no grain boundary therein, and a crystal axis of said crystalline semiconductor film in one of said two thin film transistors deviates from a crystal axis of the crystalline semiconductor film of the other and the deviation of the crystal axis is within ±10°.

2. The semiconductor device according to claim 1 wherein said crystalline semiconductor film contains hydrogen at a density of 0.001 to 1 atom %.

3. The semiconductor device according to claim 1 wherein a concentration of carbon and nitrogen present in said crystalline semiconductor film is not higher than $5 \times 10^{18}$ atoms/cm$^3$ and a concentration of oxygen present in said crystalline semiconductor film is not higher than $5 \times 10^{19}$ atoms/cm$^3$.

4. A semiconductor device comprising:
   at least two thin film transistors formed over a substrate, each of said thin film transistors having a crystalline semiconductor film comprising silicon formed on an insulating surface as an active region thereof,
   wherein said crystalline semiconductor film of each of said two thin film transistors has substantially no grain boundary therein, and a rotating angle around a crystal axis of said crystalline semiconductor film in one of said two thin film transistors deviates from a rotating angle of a crystal axis of the crystalline semiconductor film of the other, and the deviation of the rotating angle is within ±10°.

5. The semiconductor device according to claim 4 wherein said crystalline semiconductor film contains hydrogen at a density of 0.001 to 1 atom %.

6. The semiconductor device according to claim 4 wherein a concentration of carbon and nitrogen present in said crystalline semiconductor film is not higher than $5\times10^{18}$ atoms/cm$^3$ and a concentration of oxygen present in said crystalline semiconductor film is not higher than $5\times10^{19}$ atoms/cm$^3$.

7. A semiconductor device comprising:

at least two thin film transistors formed over a substrate, each of said thin film transistors having a crystalline semiconductor film comprising silicon formed on an insulating surface as an active region thereof, wherein said crystalline semiconductor film of each of said two thin film transistors has substantially no grain boundary therein, and wherein a crystal axis of the semiconductor film in one of the two thin film transistors deviate with a crystal axis of the semiconductor film in the other, and the deviation of the crystal axis is within ±10°, and wherein a rotating angle around a crystal axis of said crystalline semiconductor film in one of said two thin film transistors deviates from a rotating angle of a crystal axis of the crystalline semiconductor film of the other, and the deviation of the rotating angle is within ±10°.

8. The semiconductor device according to claim 7 wherein said crystalline semiconductor film contains hydrogen at a density of 0.001 to 1 atom %.

9. The semiconductor device according to claim 7 wherein a concentration of carbon and nitrogen present in said crystalline semiconductor film is not higher than $5\times10^{18}$ atoms/cm$^3$ and a concentration of oxygen present in said crystalline semiconductor film is not higher than $5\times10^{19}$ atoms/cm$^3$.

10. A semiconductor device comprising:

at least a pair of complementary n-channel and p-channel thin film transistors formed over a substrate, each of said thin film transistors having a crystalline semiconductor film comprising silicon formed on an insulating surface as an active region thereof, wherein said crystalline semiconductor film of each of said thin film transistors has substantially no grain boundary therein, and a crystal axis of said crystalline semiconductor film in one of said thin film transistors deviates from a crystal axis of the crystalline semiconductor film of the other, and the deviation of the crystal axis is within ±10°.

11. The semiconductor device according to claim 10 wherein said crystalline semiconductor film contains hydrogen at a density of 0.001 to 1 atom %.

12. The semiconductor device according to claim 10 wherein a concentration of carbon and nitrogen present in said crystalline semiconductor film is not higher than $5\times10^{18}$ atoms/cm$^3$ and a concentration of oxygen present in said crystalline semiconductor film is not higher than $5\times10^{19}$ atoms/cm$^3$.

13. A semiconductor device comprising:

at least one pair of n-channel and p-channel thin film transistors formed over a substrate, each of said thin film transistors having a crystalline semiconductor film comprising silicon formed on an insulating surface as an active region thereof, wherein said crystalline semiconductor film of each of said thin film transistors has substantially no grain boundary therein, and has a rotating angle around a crystal axis of said crystalline semiconductor thin film in one of said thin film transistors deviates from a rotating angle of a crystal axis the crystalline semiconductor film of the other, and the deviation of the rotating angle is within ±10°.

14. The semiconductor device according to claim 13 wherein said crystalline semiconductor film contains hydrogen a density of 0.001 to 1 atom %.

15. The semiconductor device according to claim 13 wherein a concentration of carbon and nitrogen present in said crystalline semiconductor film is not higher than $5\times10^{18}$ atoms/cm$^3$ and a concentration of oxygen present in said crystalline semiconductor film is not higher than $5\times10^{19}$ atoms/cm$^3$.

16. A semiconductor device comprising:

at least one pair of n-channel and p-channel thin film transistors formed over a substrate, each of said thin film transistors having a crystalline semiconductor film comprising silicon formed on an insulating surface as an active region thereof, wherein said crystalline semiconductor film of each of said thin film transistors has substantially no grain boundary therein, and wherein a crystal axis of the semiconductor film in one of the thin film transistors deviate with a crystal axis of the semiconductor film in the other, and the deviation of the crystal axis is within ±10°, and wherein a rotating angle around a crystal axis of said crystalline semiconductor film in one of said thin film transistors deviates from a rotating angle of a crystal axis of the crystalline semiconductor film of the other, and the deviation of the rotating angle is within ±10°.

17. The semiconductor device according to claim 16 wherein said crystalline semiconductor film contains hydrogen at a density of 0.001 to 1 atom %.

18. The semiconductor device according to claim 16 wherein a concentration of carbon and nitrogen present in said crystalline semiconductor film is not higher than $5\times10^{18}$ atoms/cm$^3$ and a concentration of oxygen present in said crystalline semiconductor film is not higher than $5\times10^{19}$ atoms/cm$^3$.

* * * * *